(12) United States Patent
Liu et al.

(10) Patent No.: US 9,117,825 B2
(45) Date of Patent: Aug. 25, 2015

(54) SUBSTRATE PAD STRUCTURE

(71) Applicant: Taiwan Semiconductor Manufacturing Company, Ltd., Hsin-Chu (TW)

(72) Inventors: Hao-Juin Liu, Kaohsiung (TW); Chita Chuang, Kaohsiung (TW); Yao-Chun Chuang, Hsin-Chu (TW); Ming Hung Tseng, Toufen Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/706,466

(22) Filed: Dec. 6, 2012

(65) Prior Publication Data

US 2014/0159203 A1 Jun. 12, 2014

(51) Int. Cl.
*H01L 23/538* (2006.01)
*H01L 23/00* (2006.01)
*H01L 23/498* (2006.01)

(52) U.S. Cl.
CPC ...... *H01L 23/5384* (2013.01); *H01L 23/49816* (2013.01); *H01L 23/49838* (2013.01); *H01L 23/49894* (2013.01); *H01L 24/13* (2013.01); *H01L 24/81* (2013.01); *H01L 24/16* (2013.01); *H01L 2224/13147* (2013.01); *H01L 2224/13564* (2013.01); *H01L 2224/13601* (2013.01); *H01L 2224/13611* (2013.01); *H01L 2224/13624* (2013.01); *H01L 2224/13639* (2013.01); *H01L 2224/13644* (2013.01); *H01L 2224/13647* (2013.01); *H01L 2224/16225* (2013.01); *H01L 2224/81191* (2013.01); *H01L 2224/81193* (2013.01); *H01L 2224/81815* (2013.01); *H01L 2924/0133* (2013.01)

(58) Field of Classification Search
CPC .............. H01L 23/5389; H01L 23/142; H01L 23/5384
USPC .................................... 257/758, 773
See application file for complete search history.

(56) References Cited

U.S. PATENT DOCUMENTS

| | | | | |
|---|---|---|---|---|
| 5,484,963 | A * | 1/1996 | Washino | 174/261 |
| 2007/0086695 | A1* | 4/2007 | Hsu | 385/14 |
| 2008/0099912 | A1* | 5/2008 | Wu | 257/737 |
| 2009/0250260 | A1 | 10/2009 | Kang | |
| 2011/0006442 | A1* | 1/2011 | Kim | 257/786 |
| 2011/0127679 | A1* | 6/2011 | Eun | 257/774 |

FOREIGN PATENT DOCUMENTS

| | | |
|---|---|---|
| KR | 20080088321 A | 10/2008 |
| KR | 20090106708 A | 10/2009 |
| KR | 20100132232 A | 12/2010 |

* cited by examiner

*Primary Examiner* — Kyoung Lee
*Assistant Examiner* — Ratisha Mehta
(74) *Attorney, Agent, or Firm* — Slater & Matsil, L.L.P.

(57) ABSTRACT

A structure comprises a first pad protruding over a top surface of a package substrate, wherein the first pad is of a first elongated shape, a second pad embedded in the package substrate, wherein the second pad is of a second elongated shape and a via coupled between the first pad and the second pad.

19 Claims, 9 Drawing Sheets

SUBSTRATE PAD STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies advance, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps. Much higher density can be achieved by employing chip-scale packaging based semiconductor devices. Furthermore, chip-scale packaging based semiconductor devices can achieve smaller form factors, cost-effectiveness, increased performance, lower power consumption and lower heat generation.

In order to increase manufacturing efficiency and lower manufacturing cost, integrated circuits may be manufactured in semiconductor wafers, each containing many identical semiconductor chips. Once the integrated circuits have been manufactured, a dicing process may be applied to the semiconductor wafers. As a result, semiconductor chips are sawed from the wafers.

In a packaging process, semiconductor chips may be attached to a package substrate. The fabrication steps of the packaging process may comprise securing the semiconductor chips on the package substrate and connecting bond pads on the semiconductor chips to bond pads on the package substrate. Furthermore, an underfill layer may be employed to further secure the bonding between the semiconductor chips and the package substrate.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a package substrate having first elongated pads formed over the package substrate and second elongated pads embedded in the package substrate. The disclosure may also be applied, however, to a variety of package substrate. Hereinafter, various embodiments will be explained in detail with reference to the accompanying drawings.

Figure 1:
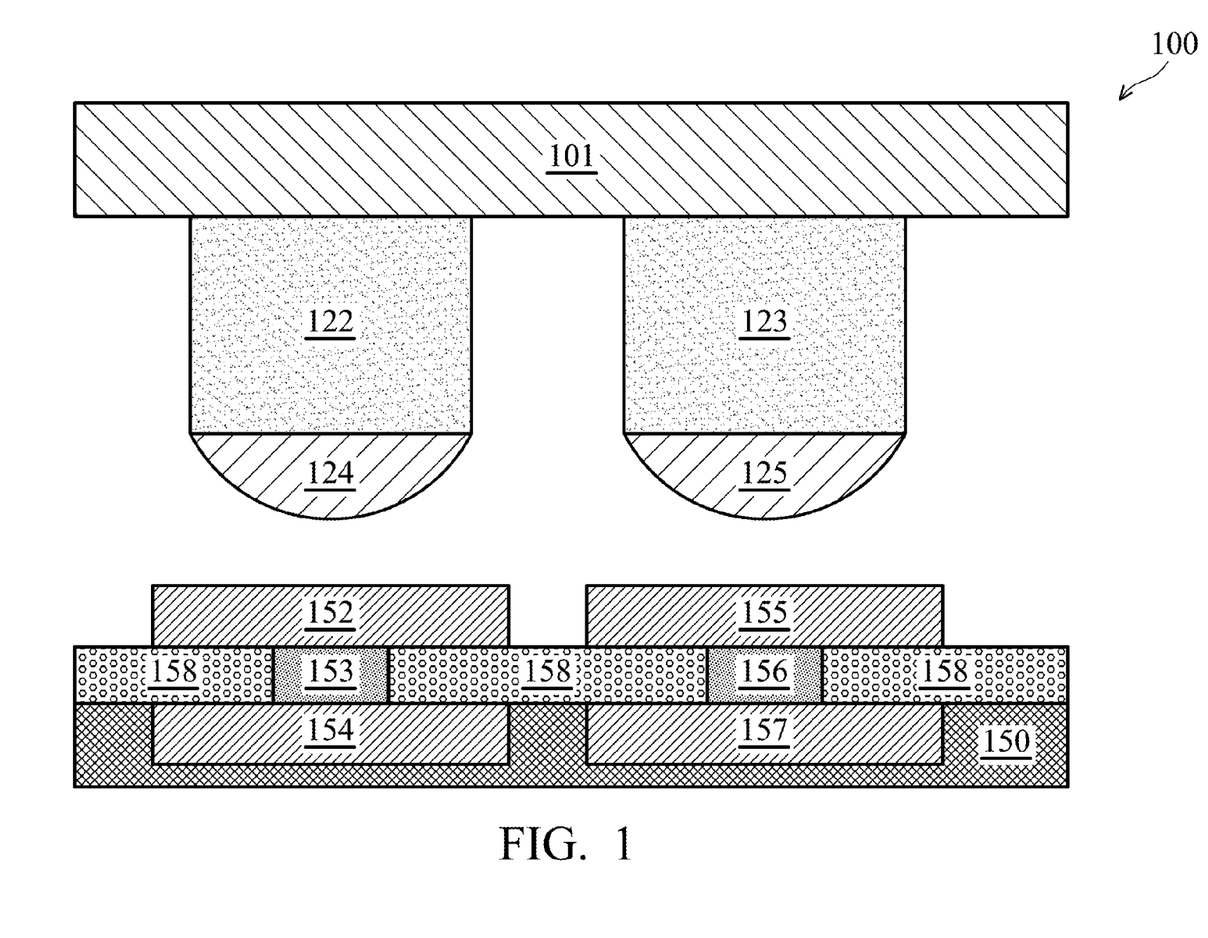
FIG. 1 illustrates a cross sectional view of a semiconductor device in accordance with various embodiments of the present disclosure.

FIG. 1 illustrates a cross sectional view of a semiconductor device in accordance with various embodiments of the present disclosure. The semiconductor device 100 may comprise a semiconductor die 101 and a substrate 150. In accordance with some embodiments, the substrate 150 may be a package substrate. More particularly, the substrate 150 may be a translation pad flip chip (TPFC) substrate.

As shown in FIG. 1, the semiconductor die 101 may comprise a plurality of metal bumps (e.g., metal bumps 122 and 123) and solder balls (e.g., solder balls 124 and 125) formed over their corresponding metal bumps. The substrate 150 may comprise a plurality of connection pad. More particularly, there may be a plurality of top pads (e.g., top pads 152 and 155) protruding over a top surface of the substrate 150. Furthermore, there may be a plurality of bottom pads (e.g., top pads 154 and 157) embedded in the substrate 150. As shown in FIG. 1, there may be a plurality of vias (e.g., vias 153 and 156) connected between the top pads and the bottom pads. In accordance with some embodiments, the pad pitch of the substrate 150 is less than 130 um.

The semiconductor die 101 will be mounted on the substrate 150 through the metal bumps (e.g., metal bumps 122 and 123) on the semiconductor die 101 and the top pads (e.g., top pads 152 and 155) on the substrate 150. As shown in FIG. 1, the top pads 152 and 155 are formed on top of the substrate 150.

Metal bumps 122 and 123 are formed on a first side of the semiconductor die 101. In some embodiments, the first side of the semiconductor die 101 is the side on which active circuits of the semiconductor die 101 are formed.

According to the bonding process of the semiconductor device 100, there may be a solder ball (e.g., solder balls 124 and 125) formed on each metal bump (e.g., metal bumps 122 and 123) before the semiconductor die 101 is mounted on the substrate 150. Furthermore, after the semiconductor die 101 is attached to the substrate 150, the solder balls 124 and 125 may be melted through a reflow process. As a result, the semiconductor die 101 is bonded on the substrate 150.

The solder balls 124 and 125 may be made of any of suitable materials. In some embodiments, the solder balls 124 and 125 may comprise SAC405. SAC405 comprises 95.5% Sn, 4.0% Ag and 0.5% Cu.

FIG. 1 further illustrates there may be a solder resistor layer 158 formed over the substrate 150. The solder resistor layer 158 is deposited on the top surface of the substrate 150. As shown in FIG. 1, the top pads 152 and 155 are protruding over the top surface of the solder resistor layer 158.

After the semiconductor die 101 is mounted on the substrate 150, an encapsulation layer (not shown) may be formed over the substrate 150 as well as the semiconductor die 101. More particularly, the semiconductor die 101 is embedded in the encapsulation layer. In some embodiments, the encapsulation layer may be a molding compound layer, an underfill layer and/or the like. Throughout the description, the encapsulation layer may be alternatively referred to as a molding compound layer.

The molding compound layer may be formed of epoxy based resins and the like. Alternatively, the molding compound layer may be replaced by photo-sensitive materials including polybenzoxazole (PBO), SU-8 photo-sensitive epoxy, film type polymer materials and/or the like. The molding compound layer can be formed by a spin-on coating process, dry film lamination process and/or the like.

An advantageous feature of having a molding compound layer is that the molding compound layer can help to protect the semiconductor die 101 from heat, shock, humidity and corrosion. In addition, the molding compound layer helps to prevent the semiconductor device 100 from cracking during reliability tests such as thermal cycling processes. Another advantageous feature is that the molding compound layer may help to reduce the mechanical and thermal stresses during the fabrication process of the semiconductor device 100.

Figure 2:
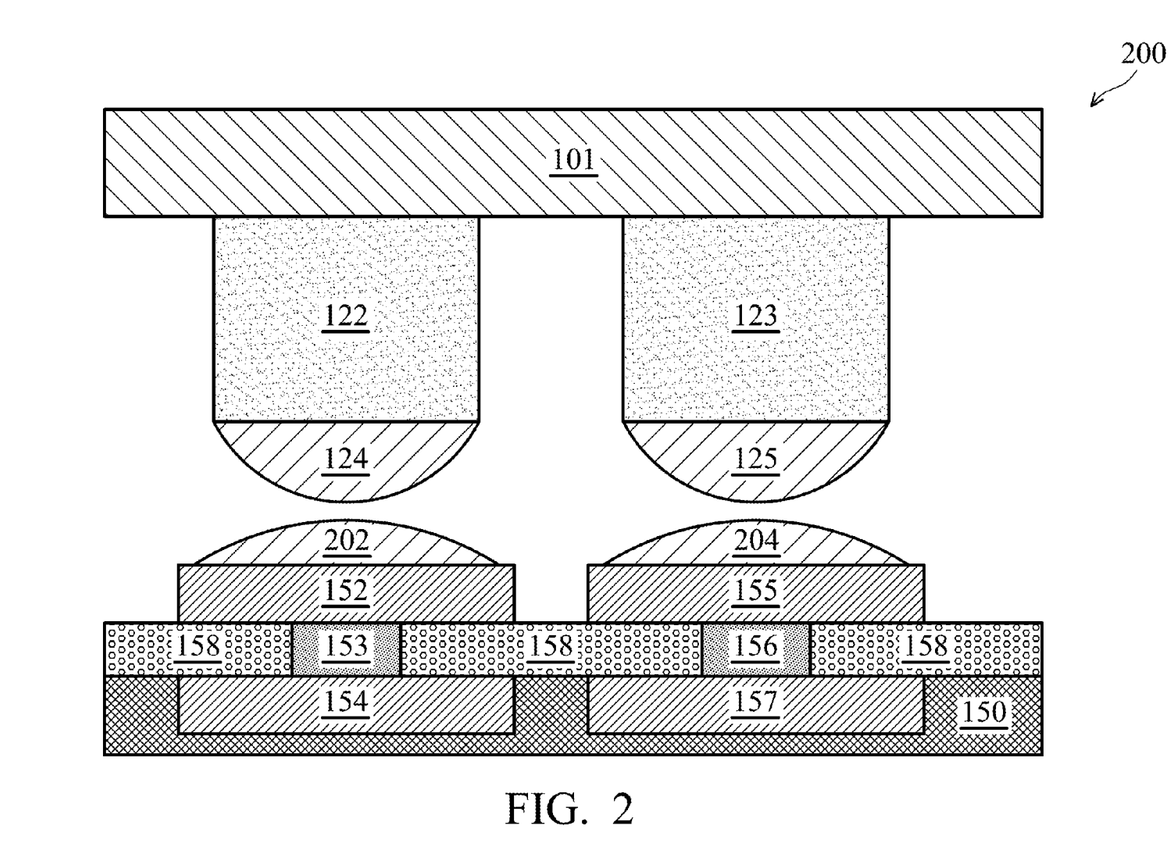
FIG. 2 illustrates a cross sectional view of another semiconductor device in accordance with various embodiments of the present disclosure.

FIG. 2 illustrates a cross sectional view of another semiconductor device in accordance with various embodiments of the present disclosure. The semiconductor device 200 shown in FIG. 2 is similar to the semiconductor device 100 shown in FIG. 1 except that solder balls 202 and 204 are formed on top of the top pads 152 and 155, and hence is not discussed herein to avoid repetition.

It should be noted that the metal bumps (e.g., metal bumps 122 and 123) shown in FIG. 1 and FIG. 2 are merely an example. The disclosure is applicable to a variety of semiconductor bumps.

Figure 3:
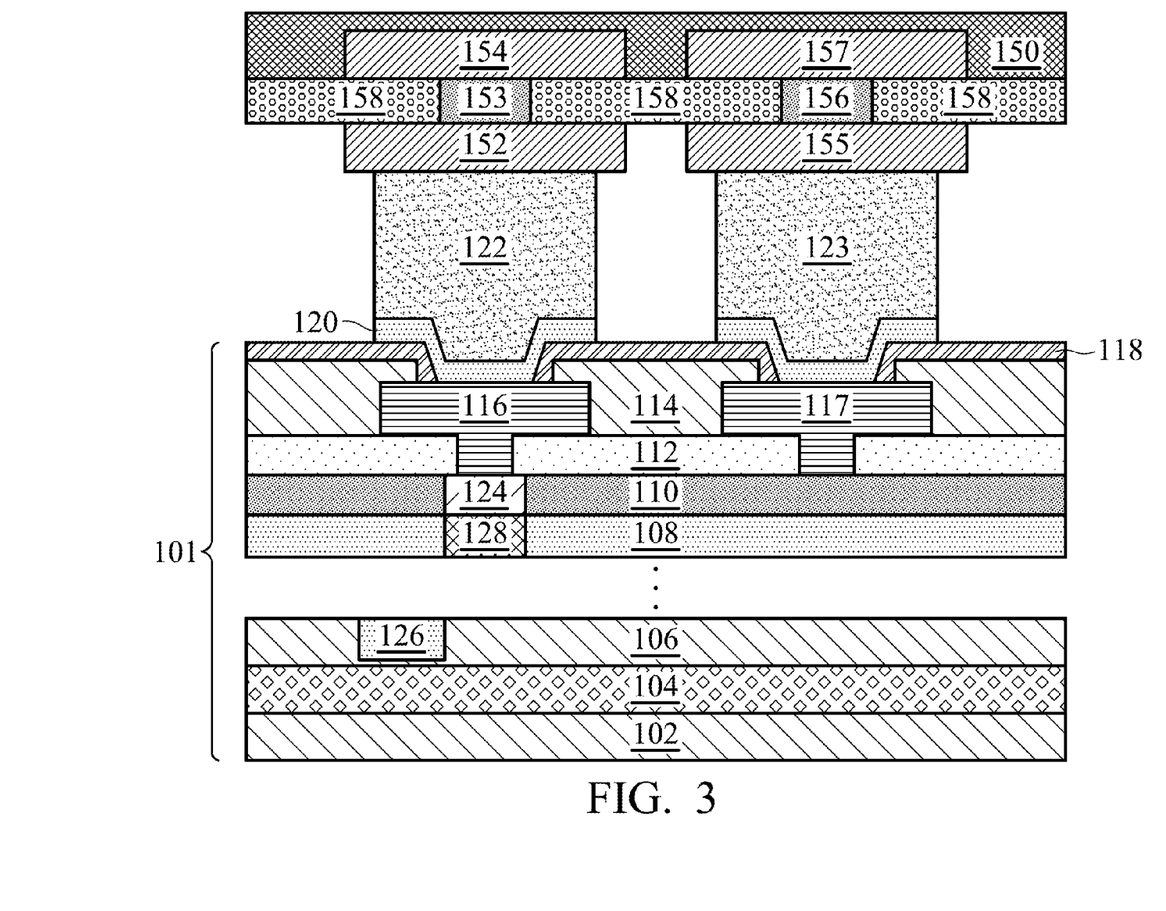
FIG. 3 illustrates in detail a cross sectional view of the semiconductor devices shown in FIG. 1 and FIG. 2 in accordance with various embodiments of the present disclosure.

FIG. 3 illustrates in detail a cross sectional view of the semiconductor devices shown in FIG. 1 and FIG. 2 in accordance with various embodiments of the present disclosure. As shown in FIGS. 1 and 2, the semiconductor device 100 includes the semiconductor die 101 and the substrate 150, wherein the semiconductor die 101 is coupled to the substrate 150 through a connection structure formed by the metal bumps (e.g., metal bump 122) and the top pads (e.g., top pad 152). The substrate 150 may be a packaging substrate such as a TPFC substrate. Alternatively, the substrate 150 may be of a structure similar to the semiconductor die 101. For simplicity, only the detailed structure of the semiconductor die 101 is illustrated in FIG. 3.

The substrate 102 may be formed of silicon, although it may also be formed of other group III, group IV, and/or group V elements, such as silicon, germanium, gallium, arsenic, and combinations thereof and/or the like. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like. The substrate 102 may further comprise a variety of electrical circuits (not shown). The electrical circuits formed on the substrate 102 may be any type of circuitry suitable for a particular application.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 3, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 3 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extremely low-k dielectric material) and conductive materials (e.g., copper).

A dielectric layer 110 is formed on top of the top metallization layer 108. As shown in FIG. 3, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and the like.

A first passivation layer 112 is formed on top of the dielectric layer 110. In some embodiments, the first passivation layer 112 is formed of non-organic materials such as undoped silicate glass, silicon nitride, silicon oxide and the like. Alternatively, the first passivation layer 112 may be formed of low-k dielectric such as carbon doped oxide and the like. In addition, extremely low-k (ELK) dielectrics such as porous carbon doped silicon dioxide can be employed to form the first passivation layer 112. The first passivation layer 112 may be formed through any suitable techniques such as CVD. As shown in FIG. 3, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 3, bond pads 116 and 117 are formed in the openings of the first passivation and second passivation layers. In some embodiments, the bond pads 116 and 117 may be formed of aluminum. For simplicity, throughout the description, the bond pads 116 and 117 may be alternatively referred to as aluminum pads 116 and 117.

The aluminum pads 116 and 117 may be enclosed by the first and second passivation layers 112 and 114. In particular, bottom portions of the aluminum pads 116 and 117 are embedded in the first passivation layer 112 and top portions of the aluminum pads 116 and 117 are embedded in the second passivation layer 114.

The first and second passivation layers 112 and 114 overlap and seal the edges of the aluminum pads 116 and 117 so as to improve electrical stability by preventing the edges of the aluminum pads 116 and 117 from corrosion. In addition, the passivation layers may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating.

A redistribution layer (not shown) may be formed in the semiconductor device 100 if the bond pads are relocated to new locations. The redistribution layer provides a conductive path between the metal lines (e.g., metal line 128) and the redistributed bond pads. The operation principles of redistribution layers are well known in the art, and hence are not discussed in detail herein.

The PI layer 118 is patterned to form a plurality of openings. Furthermore, various under bump metal (UBM) structures 120 are formed on top of the openings. The UBM structures 120 are employed to connect the aluminum pads (e.g., aluminum pads 116 and 117) with various input and output terminals (e.g., bumps 122 and 123). The UBM structures 120 may be formed by any suitable techniques such as electroplating. Other processes of formation such as sputtering, evaporation, PECVD and the like may alternatively be used depending upon the desired materials.

In some embodiments, the metal bumps 122 and 123 may be a copper bump. The copper bump may be of a height of approximately 45 um. In some embodiments, a variety of semiconductor packaging technologies such as sputtering, electroplating and photolithography can be employed to form the copper bump. As known in the art, in order to insure the reliable adhesion and electrical continuity between the copper bumps and the bond pads 116 and 117, additional layers including a barrier layer, an adhesion layer and a seed layer (not shown respectively) may be formed between the copper bumps and the bond pads 116 and 117.

Figure 4:
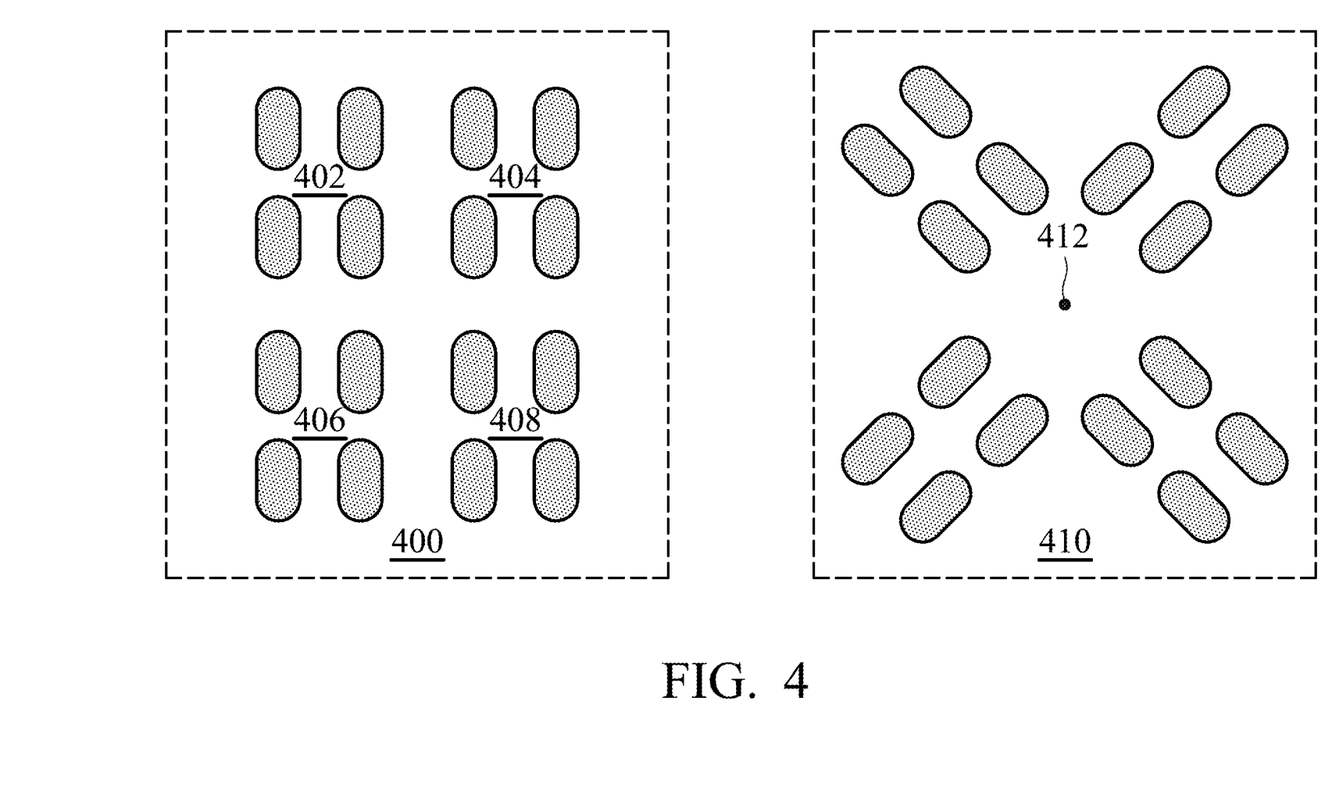
FIG. 4 illustrates top views of top pads and bottom pads in accordance with various embodiments of the present disclosure.

FIG. 4 illustrates top views of top pads and bottom pads in accordance with various embodiments of the present disclosure. Referring back to FIG. 1, there may be a plurality of top pads on the substrate 150 and a plurality of bottom pads embedded in the substrate 150. However, the cross sectional view of FIG. 1 does not illustrate the shape of the top and bottom pads.

A first top view 400 shows the top pads and the bottom pads may be elongated pads. It should be noted that the shape shown in FIG. 4 is merely an example, which should not unduly limit the scope of the claims. One of ordinary skill in the art would recognize many variations, alternatives, and modifications. For example, it is within the scope and spirit of the present disclosure for the pads to comprise other shapes, such as, but no limited to a rectangle with curved sides, a square with curved sides, an oval, a polygon, any combinations thereof and/or the like.

The first top view 400 shows four groups of pads. However, a person skilled in art will recognize that the substrate 150 may be of a plurality of top pads and bottom pads. In addition, the plurality of top pads are elongated in shape and arranged in rows and columns over the top surface of the substrate 150. Likewise, the plurality of bottom pads are elongated in shape and arranged in rows and columns in the substrate 150.

A second top view 410 shows the top pads and bottom pads may be of an elongated shape and arranged in a centripetal pattern. In particular, the top surface of the substrate 150 may be of a center 412 as shown in FIG. 4. The top pads or the bottom pads may be elongated in shape. The longer axis of each elongated pad is oriented toward the center 412. It should be noted that while the second top view 410 illustrates sixteen elongated pads, the semiconductor device could accommodate any number of elongated pads.

Figure 5:
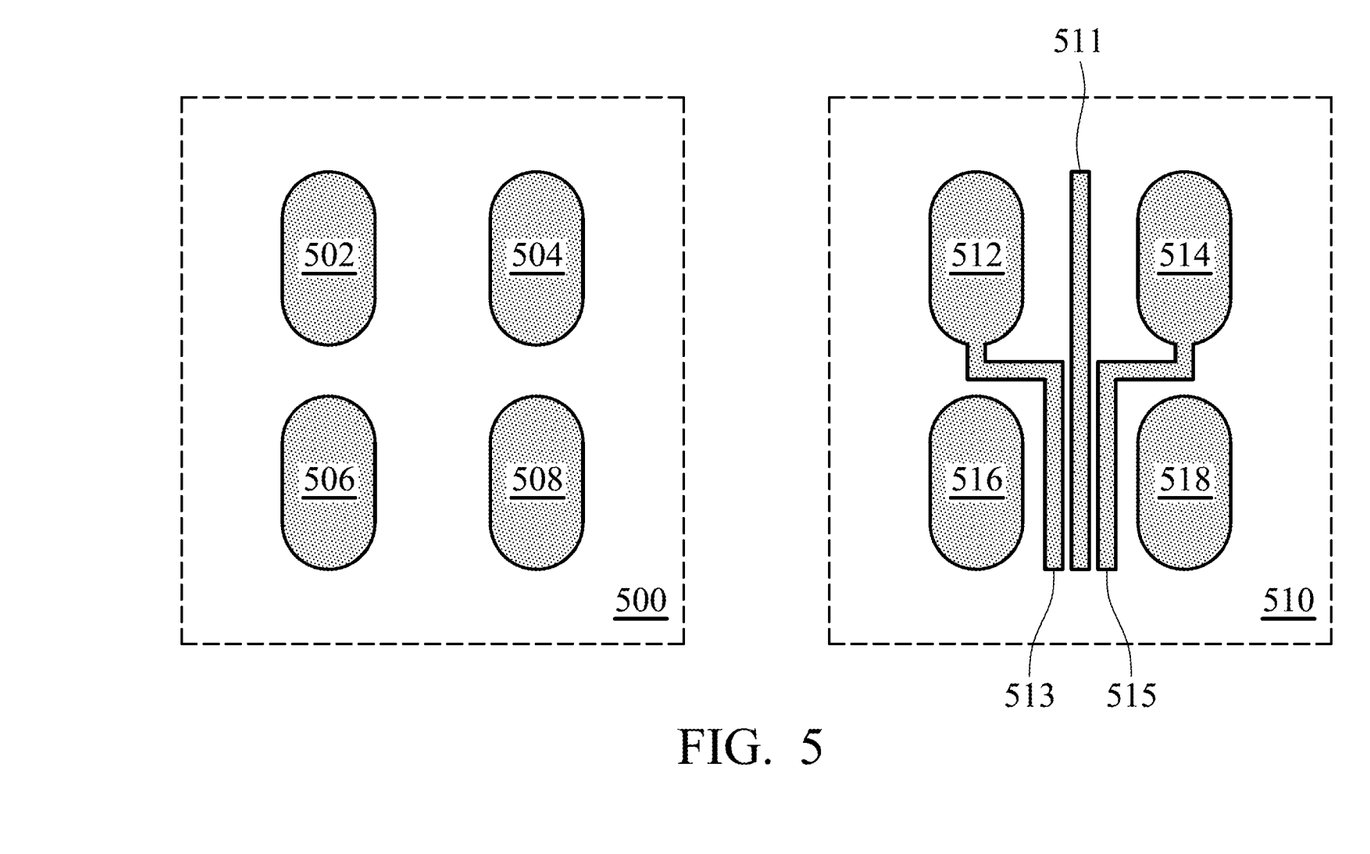
FIG. 5 illustrates a top view of top pads and bottom pads in accordance with various embodiments of the present disclosure.

FIG. 5 illustrates a top view of top pads and bottom pads in accordance with various embodiments of the present disclosure. In accordance with some embodiments, a first top view 500 illustrates the shape of top pads of the substrate 150 (shown in FIG. 1). As shown in FIG. 5, the top pads 502, 504, 506 and 508 are elongated in shape.

A second top view 510 illustrates the shape of bottom pads of the substrate 150. As shown in FIG. 5, the bottom pads 512, 514, 516 and 518 are elongated in shape. In addition, traces 513 and 515 are coupled to bottom pads 512 and 514 respectively. The traces 511, 513 and 515 are placed between the bottom pads 512, 514, 516 and 518.

One advantageous feature of having elongated bottom pads as shown in FIG. 5 is that the elongated bottom pads (e.g., bottom pads 512 and 514) may provide more routing space for the traces coupled to the bottom pads.

Figure 6:
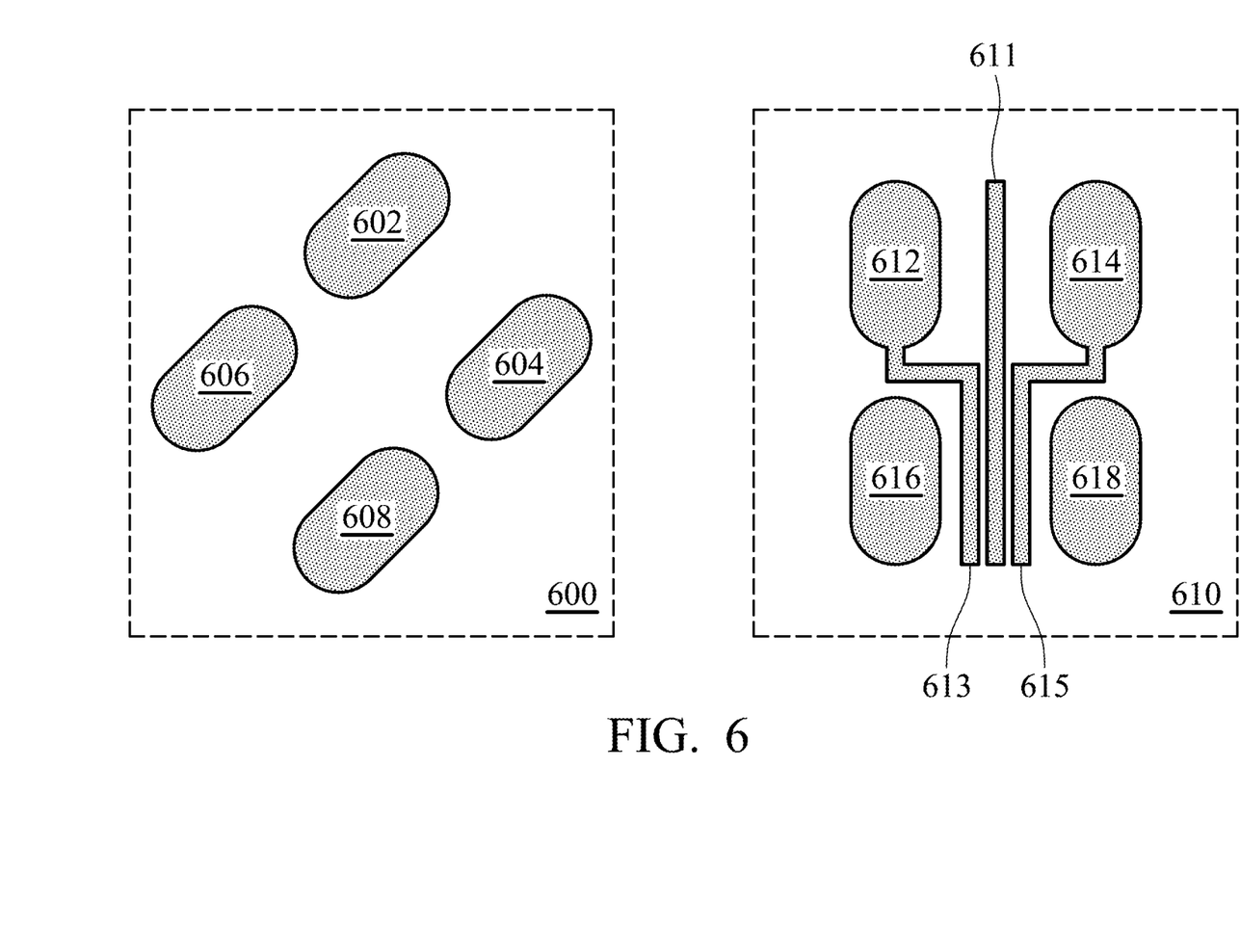
FIG. 6 illustrates another top view of top pads and bottom pads in accordance with various embodiments of the present disclosure.

FIG. 6 illustrates another top view of top pads and bottom pads in accordance with various embodiments of the present disclosure. The top view shown in FIG. 6 is similar to the top view shown in FIG. 5 except that the top pads of the substrate 150 (shown in FIG. 1) may be arranged in a centripetal pattern. The pads arranged in a centripetal pattern have been described in detail with respect to FIG. 4, and hence are not discussed herein to avoid repetition.

Figure 7:
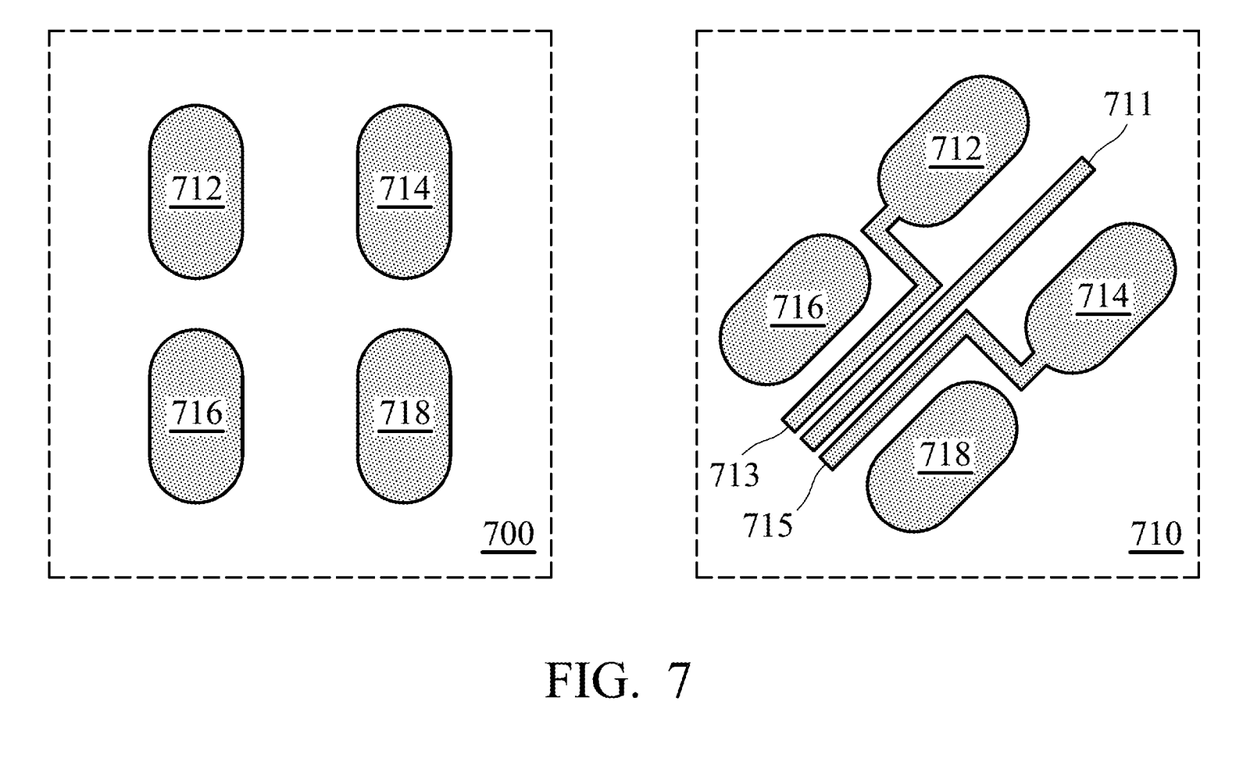
FIG. 7 illustrates another top view of top pads and bottom pads in accordance with various embodiments of the present disclosure.

FIG. 7 illustrates another top view of top pads and bottom pads in accordance with various embodiments of the present disclosure. The top view shown in FIG. 7 is similar to the top view shown in FIG. 5 except that the bottom pads and the traces coupled to the bottom pads may be arranged in a centripetal pattern. The pads arranged in a centripetal pattern have been described in detail with respect to FIG. 4, and hence are not discussed herein to avoid repetition.

Figure 8:
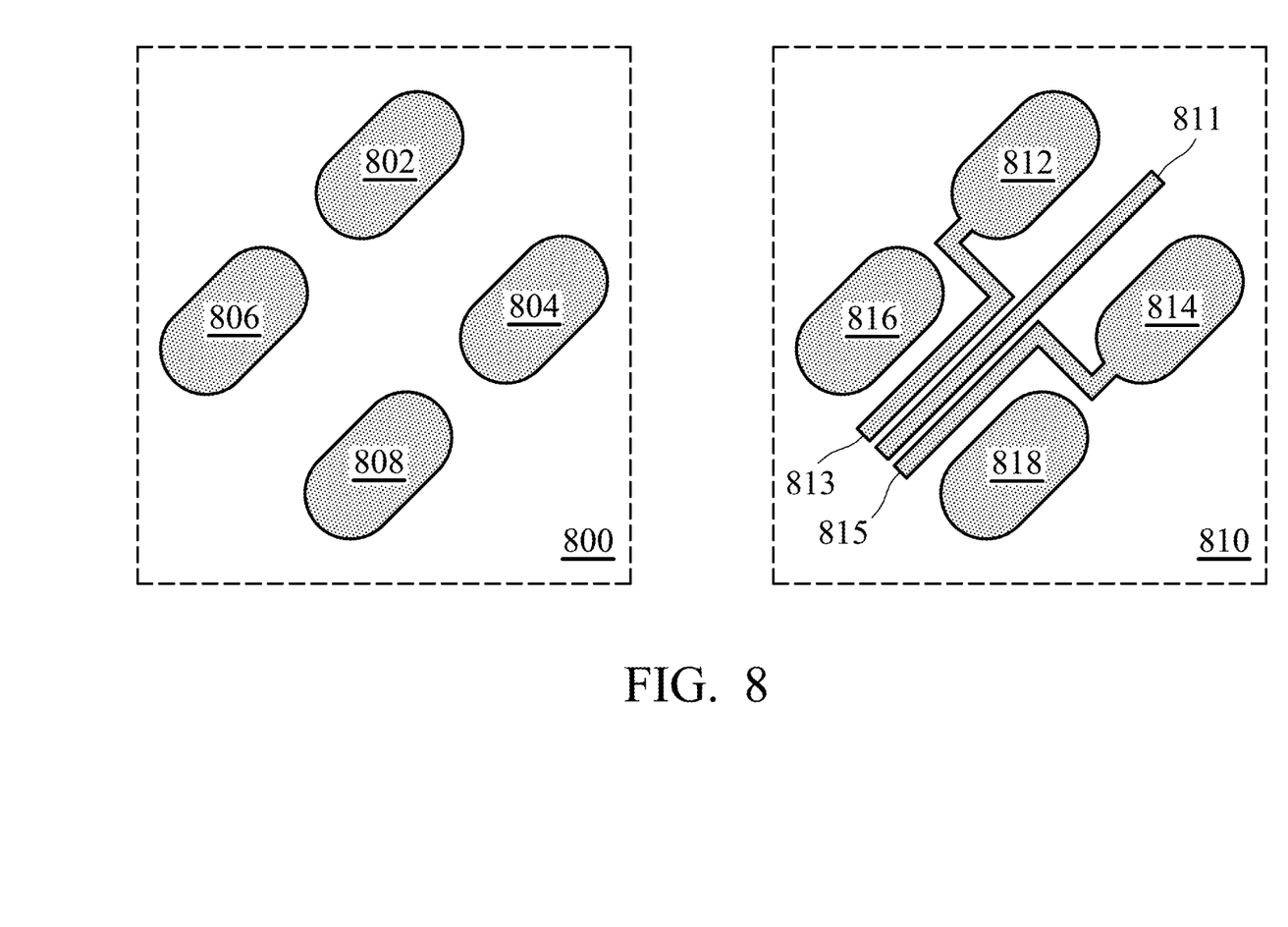
FIG. 8 illustrates another top view of top pads and bottom pads in accordance with various embodiments of the present disclosure.

FIG. 8 illustrates another top view of top pads and bottom pads in accordance with various embodiments of the present disclosure. The top view shown in FIG. 8 is similar to the top view shown in FIG. 5 except that both the top pads and the bottom pads of the substrate 150 may be arranged in a centripetal pattern. The pads arranged in a centripetal pattern have been described in detail with respect to FIG. 4, and hence are not discussed herein to avoid repetition.

Figure 9:
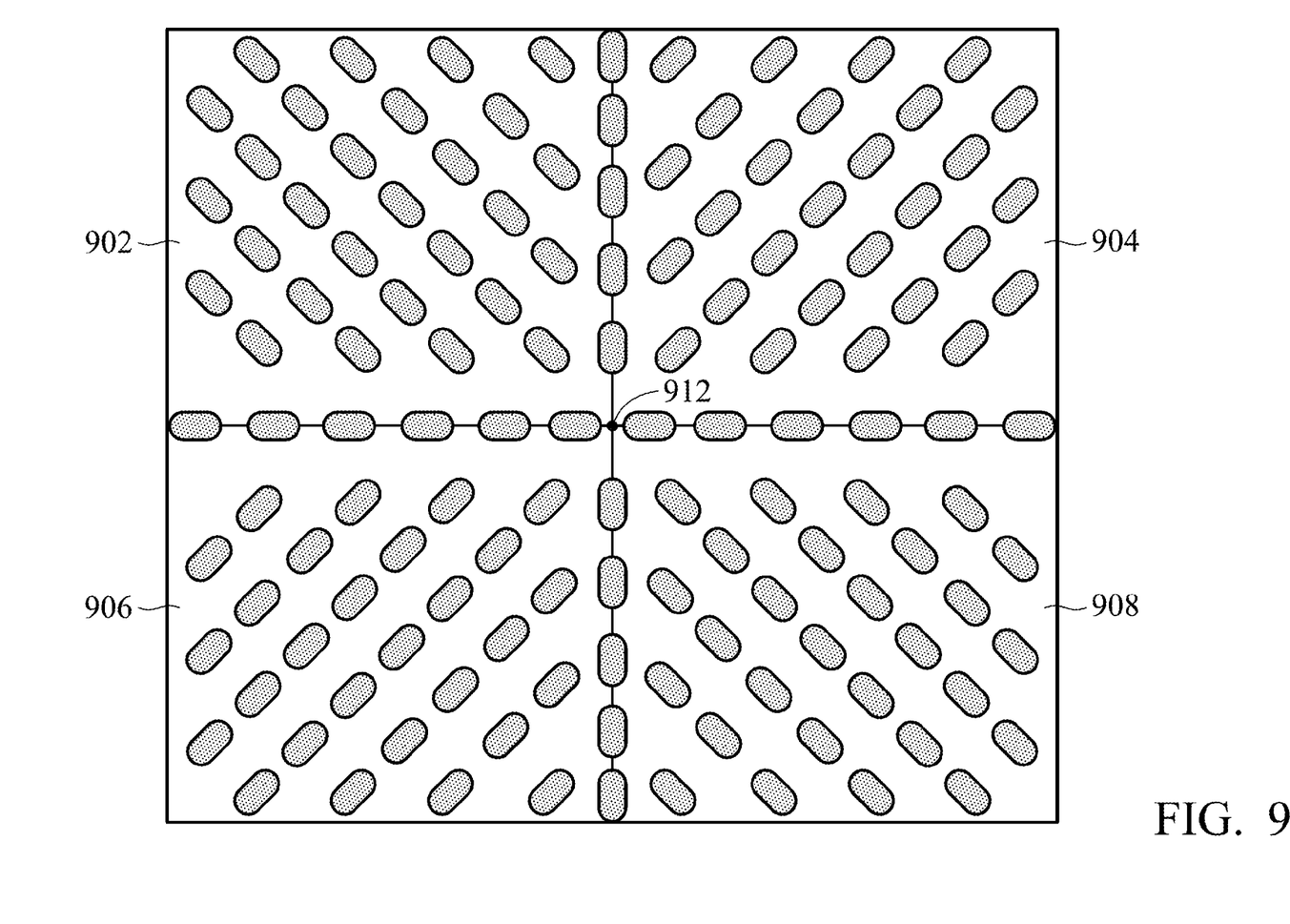
FIG. 9 illustrates another pad arrangement in accordance with various embodiments of the present disclosure.

FIG. 9 illustrates another pad arrangement in accordance with various embodiments of the present disclosure. The pads arranged in a centripetal pattern have been described in detail in FIG. 4. Referring back to FIG. 4, there may be a center 412 in FIG. 4. The longer axes of the elongated pads shown in FIG. 4 are oriented toward the center 412. In other words, the elongated pads shown in FIG. 4 are arranged in a centripetal pattern.

This centripetal pattern shown in FIG. 4 is merely an example, which should not unduly limit the scope of the claims. One of ordinary skill in the art would recognize many variations, alternatives, and modifications. For example, as shown in FIG. 9, the top surface of the substrate 150 may be divided into four regions, namely 902, 904, 906 and 908. The elongated pads in each region (e.g., region 902) may be oriented toward the center 912 of the top surface of the substrate 150.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a first pad protruding over a top surface of a package substrate, wherein the first pad is of a first elongated shape;
a second pad embedded in the package substrate, wherein the second pad is of a second elongated shape, and wherein the first pad and the second pad are separated by a solder resistor layer; and
a via coupled between the first pad and the second pad.

2. The structure of claim 1, further comprising:
a third pad embedded in the package substrate and located adjacent to the second pad; and
a trace coupled to the second pad and placed between the second pad and the third pad.

3. The structure of claim 1, wherein:
the first elongated shape is selected from a group consisting of a rectangle with curved sides, an oval, a polygon and a square with curved sides.

4. The structure of claim 1, wherein:
the second elongated shape is selected from a group consisting of a rectangle with curved sides, an oval, a polygon and a square with curved sides.

5. The structure of claim 1, further comprising:
a plurality of bottom pads embedded in the package substrate, wherein:
the bottom pads are of the elongated shape; and
the bottom pads are arranged in a centripetal pattern; and
a plurality of top pads protruding over the package substrate, wherein:
the top pads are of the elongated shape; and
the top pads are arranged in rows and columns.

6. The structure of claim 1, further comprising:
a plurality of bottom pads embedded in the package substrate, wherein:
the bottom pads are of the elongated shape; and
the bottom pads are arranged in rows and columns; and
a plurality of top pads protruding over the package substrate, wherein:
the top pads are of the elongated shape; and
the top pads are arranged in a centripetal pattern.

7. The structure of claim 1, wherein:
a plurality of bottom pads embedded in the package substrate, wherein:
the bottom pads are of the elongated shape; and
the bottom pads are arranged in rows and columns; and
a plurality of top pads protruding over the package substrate, wherein:
the top pads are of the elongated shape; and
the top pads are arranged in rows and columns.

8. The structure of claim 1, further comprising:
a plurality of bottom pads embedded in the package substrate, wherein:
the bottom pads are of the elongated shape; and
the bottom pads are arranged in a centripetal pattern; and
a plurality of top pads protruding over the package substrate, wherein:
the top pads are of the elongated shape; and
the top pads are arranged in the centripetal pattern.

9. A device comprising:
a semiconductor die comprising active circuits;
a metal bump formed on a first side of the semiconductor die, wherein the active circuits are located adjacent to the first side;
a package substrate coupled to the semiconductor die through the metal bump, wherein the package substrate comprises:
a plurality of active circuits;
a top pad protruding over a top surface of the package substrate, wherein the top pad is of a first elongated shape;
a bottom pad embedded in the package substrate, wherein the bottom pad is of a second elongated shape, and wherein an outer edge of the top pad is substantially aligned with an outer edge of the bottom pad in a vertical direction; and
a via coupled between the top pad and the bottom pad; and
a solder resistor layer formed over the package substrate, wherein the top pad protrudes over a top surface of the solder resistor layer.

10. The device of claim 9, wherein:
the metal bump is formed of copper.

11. The device of claim 9, further comprising:
a plurality of connection pads formed over the package substrate, wherein the connection pads are arranged in a centripetal pattern.

12. The device of claim 9, further comprising:
a plurality of connection pads formed over the package substrate, wherein the connection pads are arranged in rows and columns.

13. The device of claim 9, further comprising:
a plurality of routing pads embedded in the package substrate, wherein the plurality of routing pads are arranged in rows and columns.

14. The device of claim 9, further comprising:
a plurality of routing pads embedded in the package substrate, wherein the plurality of routing pads are arranged in a centripetal pattern.

15. A method comprising:
forming a plurality of first pads in a package substrate comprising a plurality of active circuits, wherein the first pads are of a first elongated shape;
forming a plurality of vias over the first pads;
forming a plurality of second pads over the vias, wherein:
the second pads are of a second elongated shape;
a first pad is substantially aligned with a corresponding second pad in a vertical direction and the first pad and the corresponding second pad are substantially equal in size; and
the second pads are coupled to the first pads through the vias; and
depositing a solder resistor layer over the package substrate, wherein the second pads are over a top surface of the solder resistor layer.

16. The method of claim 15, wherein:
the first pads are arranged in rows and columns; and
the second pads are arranged in a centripetal pattern.

17. The method of claim 15, wherein:
the first pads are arranged in a centripetal pattern; and
the second pads are arranged in rows and columns.

18. The method of claim 15, wherein:
the first pads are arranged in rows and columns; and
the second pads are arranged in rows and columns.

19. The method of claim 15, wherein:
the first pads are arranged in a centripetal pattern; and
the second pads are arranged in a centripetal pattern.

* * * * *